(12) United States Patent
Wu et al.

(10) Patent No.: US 7,919,827 B2
(45) Date of Patent: Apr. 5, 2011

(54) METHOD AND STRUCTURE FOR REDUCING NOISE IN CMOS IMAGE SENSORS

(75) Inventors: Tien-Chi Wu, Yonghe (TW); Tsung-Yi Lin, Caotun Township, Nantou County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 378 days.

(21) Appl. No.: 11/077,576

(22) Filed: Mar. 11, 2005

(65) Prior Publication Data
US 2006/0202295 A1 Sep. 14, 2006

(51) Int. Cl.
*H01L 27/146* (2006.01)

(52) U.S. Cl. ........ 257/435; 257/222; 257/291; 257/294; 257/E27.133; 257/E31.121

(58) Field of Classification Search ................... 257/291, 257/435, E27.133, E27.151, E27.13, 222, 257/294, E31.121, E31.122
See application file for complete search history.

(56) References Cited

U.S. PATENT DOCUMENTS

| 6,069,378 | A  | * | 5/2000  | Toyoda et al. ................ 257/294 |
|-----------|----|---|---------|---------------------------------------|
| 6,303,919 | B1 | * | 10/2001 | Yokomichi et al. ........ 250/208.1 |
| 6,465,859 | B1 | * | 10/2002 | Fujiwara et al. ............... 257/435 |
| 6,570,222 | B2 | * | 5/2003  | Nozaki et al. .................. 257/347 |
| 6,867,062 | B2 | * | 3/2005  | Stevens ........................... 438/57 |
| 7,005,690 | B2 | * | 2/2006  | Chijiiwa et al. ............... 257/292 |
| 7,030,918 | B1 | * | 4/2006  | Nakashiba ..................... 348/294 |
| 7,053,458 | B2 | * | 5/2006  | Mann et al. .................... 257/452 |
| 7,091,532 | B2 | * | 8/2006  | Stevens ......................... 257/222 |
| 7,113,215 | B2 | * | 9/2006  | Kokubun ....................... 348/308 |
| 7,754,981 | B2 | * | 7/2010  | Arakawa et al. .............. 174/389 |
| 2002/0158294 | A1 | * | 10/2002 | Fujiwara et al. ............... 257/431 |
| 2004/0004254 | A1 | * | 1/2004  | Watanabe ..................... 257/347 |
| 2005/0030399 | A1 | * | 2/2005  | Suzuki et al. ................. 348/294 |
| 2006/0011808 | A1 | * | 1/2006  | Li et al. ..................... 250/208.1 |

FOREIGN PATENT DOCUMENTS

WO   WO2004/093513   * 10/2004

* cited by examiner

*Primary Examiner* — Lynne A Gurley
*Assistant Examiner* — Jesse Y Miyoshi
(74) *Attorney, Agent, or Firm* — Duane Morris LLP

(57) ABSTRACT

A method and device is disclosed for reducing noises in CMOS image sensors. An improved CMOS image sensor includes a light sensing structure surrounded by a support feature section. An active section of the light sensing structure is covered by no more than optically transparent materials. A light blocking portion includes a black light filter layer and an opaque layer covering the support feature section. The light blocking portion may also cover a peripheral portion of the light sensing structure. The method for forming the CMOS image sensors includes using film patterning and etching processes to selectively form the opaque layer where the light blocking portion is desired but not over the active section.

13 Claims, 3 Drawing Sheets

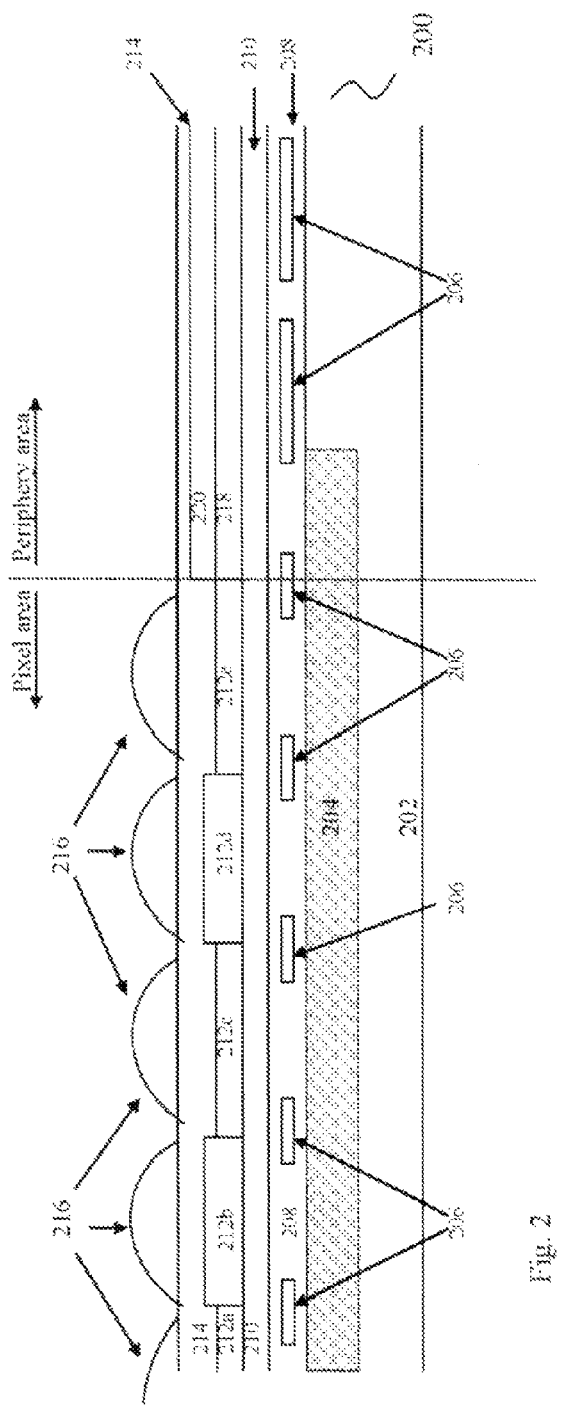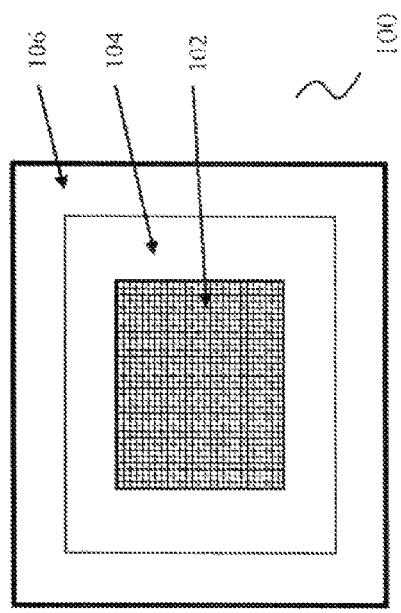
Fig. 1
PRIOR ART
Fig. 2
PRIOR ART

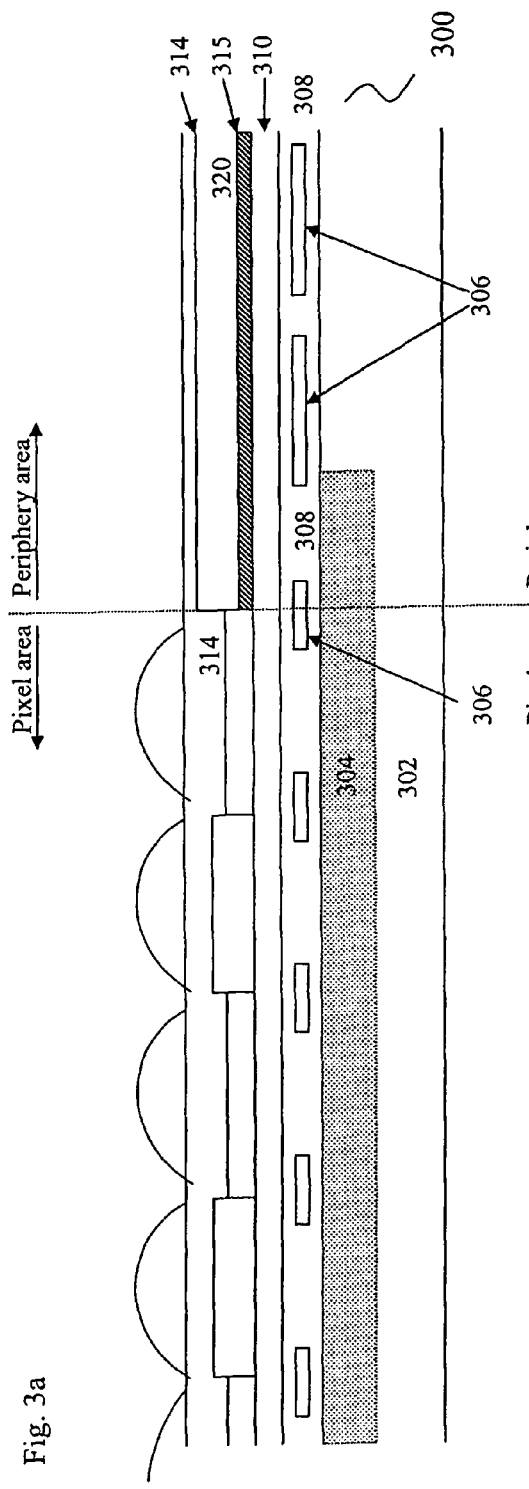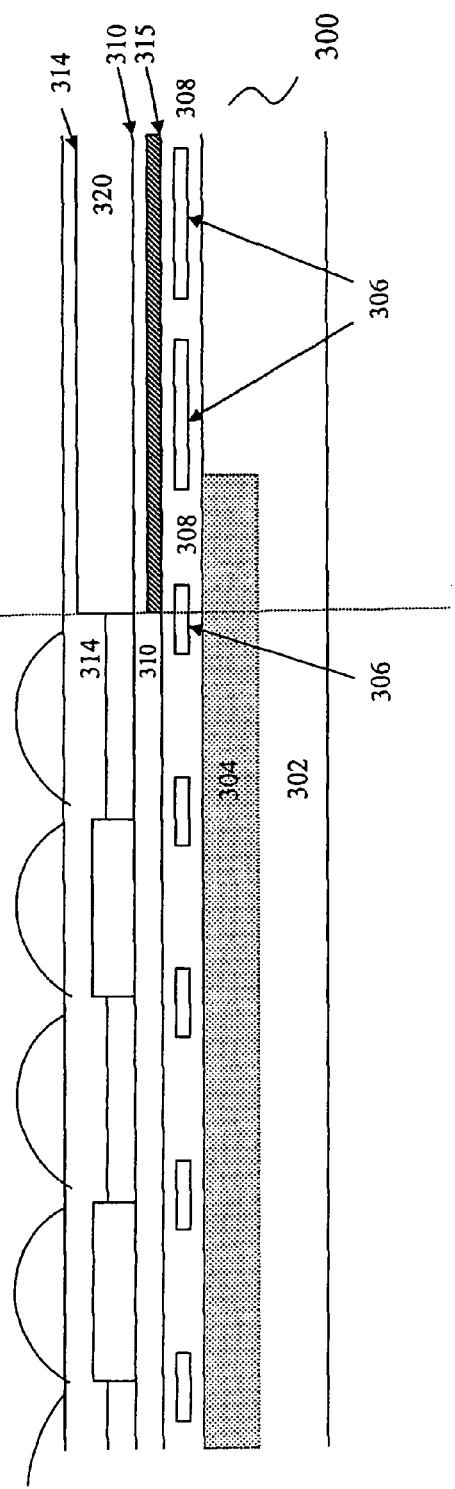
Fig. 3a
Fig. 3b

METHOD AND STRUCTURE FOR REDUCING NOISE IN CMOS IMAGE SENSORS

BACKGROUND

The present invention relates generally to the field of imaging devices, and more particularly to the improvement of noise immunity within the structures of CMOS image sensors.

Solid state image sensors, such as charged-coupled devices (CCD) and CMOS (complimentary metal oxide silicon field effect transistor) image sensors (CIS) are commonly used as input devices for electronic video and still cameras, robotic/machine vision, and etc. These sensors are comprised of a light sensing element (photodiode) within individual pixels that are arranged into two-dimensional rows and columns as pixel arrays. The light data captured by the plurality of the light sensing pixels are together processed using associated logic and amplifying circuits to generate a whole optical image as sensed by the pixel array. Each pixel may include a color filter located over the light sensing element to selectively process image data by a specific color. Conventional solid state CIS devices are designed such that the incoming light beams are focused by a microlens through a color filter layer such that they converge along the focal axis of the microlens to strike the light sensing element (photodiode). The photoenergy from the light beams, upon striking the photodiode, frees electrons within the photodiode to be processed as the pixel's image data. However during actual operation of the image sensor, stray and undesired light beams not directly representative of the intended image capture, may strike the microlens at oblique incident angles. At certain oblique angles and light intensities, the stray and undesired light beams may manifest as electrical noise data generated by the photodiode to adversely affect the processed image. As result, the noise data degrades the accuracy and quality of the captured and processed image.

A major source of stray and undesired light beams occurs at the dimensional boundary edges of the active pixel array. At these boundary edges the incoming light beams may strike nearby non-light sensing peripheral structures and become diffracted back onto the pixels' microlens as stray and undesired light beams. These peripheral structures may include the support decoder, timer, amplifier circuits, data bus, and contact structures used for the image processing of the electrical data generated by the light sensitive pixel array. Conventional color CIS devices commonly use the application of semi-opaque light shielding layers to cover these peripheral structures located outside of the light sensitive pixel array. The light shield layers are very effective in reducing most of the light diffracted back onto the pixel array. However, the conventional light shield layers do not totally block the incoming light. As new device and process technologies advance, the light sensitive pixel arrays become geometrically smaller and denser. The smaller, denser pixel arrays are more susceptible to the noise issues and problems generated by stray and undesired light beams.

What is desired is an improved method for the enhancement of noise immunity within the image sensors. Such an improved method would further minimize or eliminate the stray and undesired light that could cause the noise generated within the pixel arrays.

SUMMARY

In view of the foregoing, this invention provides a method and device for reducing noise in CMOS image sensors. An improved CMOS image sensor includes a light sensing structure surrounded by a support feature section. An active section of the light sensing structure is covered by no more than optically transparent materials. A light blocking portion includes a black light filter layer and an opaque layer covering the support feature section. The light blocking portion may also cover a peripheral portion of the light sensing structure. The method for forming the CMOS image sensors includes using film patterning and etching processes to selectively form the opaque layer where the light blocking portion is desired but not over the active section.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a top view of a conventional CMOS image sensor.

FIG. 2 is a cross-sectional view of a portion of a conventional CMOS image sensor illustrating the structures near the boundary between the light sensitive pixel array and support periphery areas.

FIGS. 3A through 3D are four different cross-sectional views for a portion of the disclosed CMOS image sensor illustrating the structures near the boundary between the light sensitive pixel array and support periphery areas as constructed in accordance with the embodiments of the present invention.

DESCRIPTION

Figure 3C:
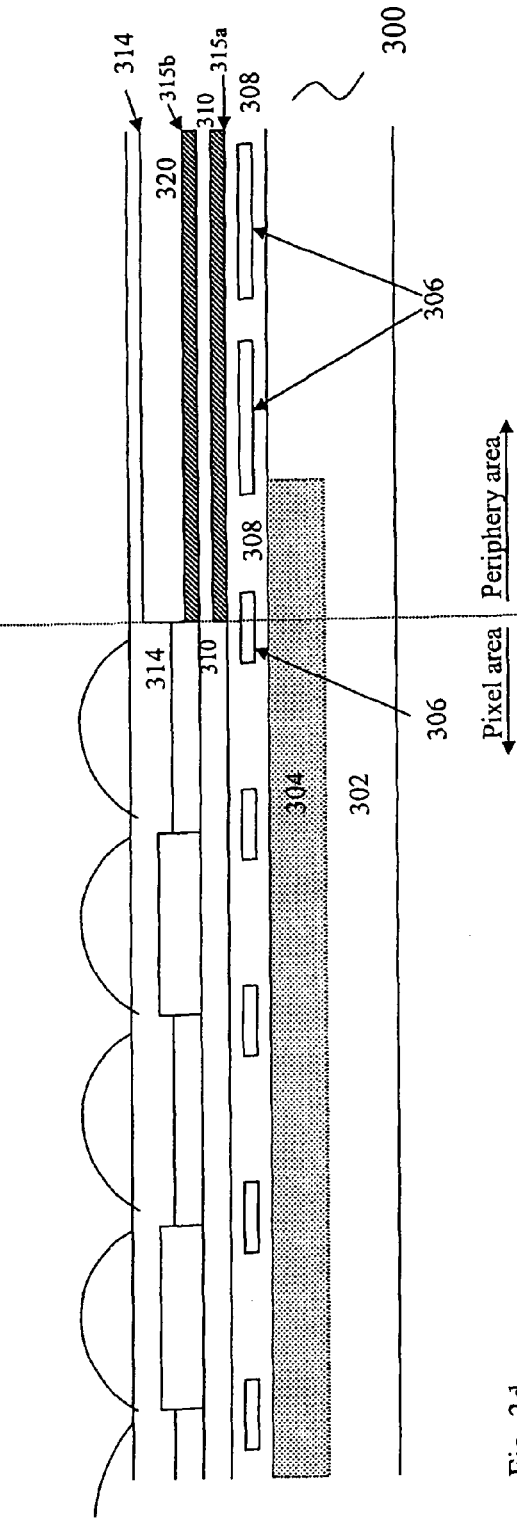

The present invention describes an improved method and structure for the enhancement of noise immunity within the CIS devices. The present invention utilizes a light blocking layer to further minimize and help eliminate the stray and undesired light that causes the electrical noise generated within the pixel arrays.

FIG. 1 illustrates major regions of a conventional CMOS image sensor (CIS) device 100 as viewed from above. A two-dimensioned light sensitive pixel array 102 is located in approximately the middle of the CIS device 100. A black/blue colored, semi-opaque light shield region 104 is located immediately surrounding the entire pixel array 102. This black/blue light shielding region 104 may be sized and constructed such that the shielding region covers only a portion of or all of the CIS device's support periphery structures. In this illustration of FIG. 1, a region of the CIS device's support periphery structures 106 located on the opposite side of the black/blue light shielding region 104 from the pixel array 102, has been left opened and exposed.

FIG. 2 illustrates a cross-sectional view of a portion of a conventional CIS device 200 illustrating the structures near the boundary between the light sensitive pixel array and support periphery areas. A vertical dotted line is marked on the CIS device 200 to show the region of the active light sensitive pixel area on the left side, and the periphery area on the right side of the dotted line that includes a peripheral portion of light sensing region 204 and the CIS device's support periphery area that surrounds light sensing region 204.

Within the pixel area of the CIS device 200, a section of the semiconductor substrate 202 contains various light sensing elements and local charge and data transfer transistors having been constructed onto and within the substrate. This light sensing and transistor region is shown within FIG. 2 as the shaded region 204. Metallized conductor lines 206 shown are located just above the light sensing region 204 that are insulated from the light sensing region 204 with an optically transparent dielectric passivation layer 208. Another optically transparent dielectric planarization layer 210 is shown located on top of the dielectric passivation layer 208. Various color filters, 212a through 212e, are located directly above the various photodiodes of the light sensing region 204, through which the image light beams are captured. A spacer dielectric layer 214 is located on top of the color filters 212a-212e to help maintain the focal length of the light beams from the microlens 216 to the photodiodes within the light sensing region 204. It is noted that there is a unique microlens 216 positioned and located directly above each photodiode of the light sensing region 204.

Within the support periphery area of the CIS device 200, a section of the semiconductor substrate 202 may also contain various local charge and data transfer transistors having been constructed onto and within the substrate within light sensing region 204 that also extends into the support periphery area. Metallized conductor data and bus lines 206 are located just above the light sensing region 204 that are insulated from light sensing region 204 with an optically transparent dielectric passivation layer 208. Another optically transparent dielectric planarization layer 210 is shown located on top of the dielectric passivation layer 208. A blue colored light shielding layer 218 is located on top of the planarization layer 210, directly above the metallized structures 206 and transistor components within the light sensing region 204 of the periphery area. Another light shielding layer 220, of a black color, is located directly on top of the first light (blue) shielding layer 218. Both light shielding layers, blue 218 and black 220, serve as the noise reduction mechanism by reducing the diffraction of oblique light at the pixel array boundary areas of conventional CIS devices.

FIGS. 3A through 3D are four different cross-sectional views of four exemplary embodiments of a CMOS image sensor according to the invention. The illustrated exemplary embodiments utilize light blocking materials to further minimize and eliminate the stray and undesired light that causes the electrical noise generated within the CIS devices' pixel arrays. It is noted that the construction and structure of the pixel area components for FIGS. 3A through 3D are substantially similar to those previously described for the conventional CIS devices shown in FIG. 2.

FIG. 3A shows light sensing structure 304 that may include photodiodes or other photosensors as well as various local charge and data transfer transistors and is formed in or on substrate 302 in the active pixel area (to the left-hand side of the dotted line) and light sensing structure 304 may optionally include a peripheral portion that extends into the periphery area (on the right-hand side of the dotted line). The periphery area also includes further support devices and structures constructed onto and within the substrate 302. Conductor lines such as metallized conductor data and bus lines 306 are located just above the light sensing structure 304 that are insulated from light sensing structure 304 with an optically transparent dielectric passivation layer 308. Another optically transparent dielectric planarization layer 310 is shown located on top of the dielectric passivation layer 308. The disclosed light blocking layer 315 is shown located on top of the planarization layer 310, directly above the metallized structures 306 and transistor components within light sensing structure 304 of the support periphery area. This light blocking layer is comprised of a thin opaque material such as a titanium nitride (TiN) film, of sufficient thickness and composition to totally block the light beam from passing through the material to reach the underlying metallized structures 306 and transistors within light sensing structure 304. It is noted that a TiN light blocking layer of 200 angstrom thickness is typically sufficient to accomplish the required light blockage. It is also noted that the light blocking layer may be composed of any other thin metals or non-metal material as long as the material layer remains sufficiently thin to accommodate the dimensional requirements of the completed CIS device and provides the capability to totally block the passage of light through the blocking material layer. The light blocking layer may be constructed upon the CIS device utilizing standard production fabrication processes such as physical sputtering, reactive sputtering, chemical vapor deposition and radiation enhanced depositions. The fabrication of the light blocking layer may also require and include the use of film patterning and etching processes to selectively place the layer upon the desired locations of the support periphery area of the CIS device. The illustration of FIG. 3A also shows an additional black colored light shield layer 320 having been placed on top of the disclosed TiN light blocking layer 315. The function of this light shielding layer 320 aids to help reduce the intensity of some of the light before it reaches the light blocking layer 315. There is a section of a spacer layer 314 located on top of the light shield layer 320.

FIG. 3B illustrates a second embodiment of the implementation of the disclosed structure of a light blocking layer. In this embodiment, the TiN light blocking layer 315 has been constructed and placed on top of the dielectric passivation layer 308, before the placement of the dielectric planarization layer 310 upon the CIS device 300. This embodiment shown as FIG. 3B places the light blocking layer 315 closer to the underlying metallized structures 306 and transistors within light sensing structure 304. The placement of the light blocking layer 315 again achieves the same purpose of the first embodiment described for FIG. 3A, by providing a method and structure to totally block the incoming light beams from passing through the layer.

FIG. 3C illustrates an embodiment of the disclosed structure. For this embodiment, there are two light blocking layers, the first light blocking layer 315a located in the CIS device's support periphery area between the dielectric passivation layer 308 and the dielectric planarization layer 310. The second light blocking layer 315b, is located in the CIS device's support periphery area between the dielectric planarization layer 310 and the light shielding layer 320. The utilization of the two light blocking layers, 315a and 315b, are effective in blocking the passage of light beams through the material layers from reaching the underlying metallized structures 306 and transistors within light sensing structure 304.

Figure 3D:
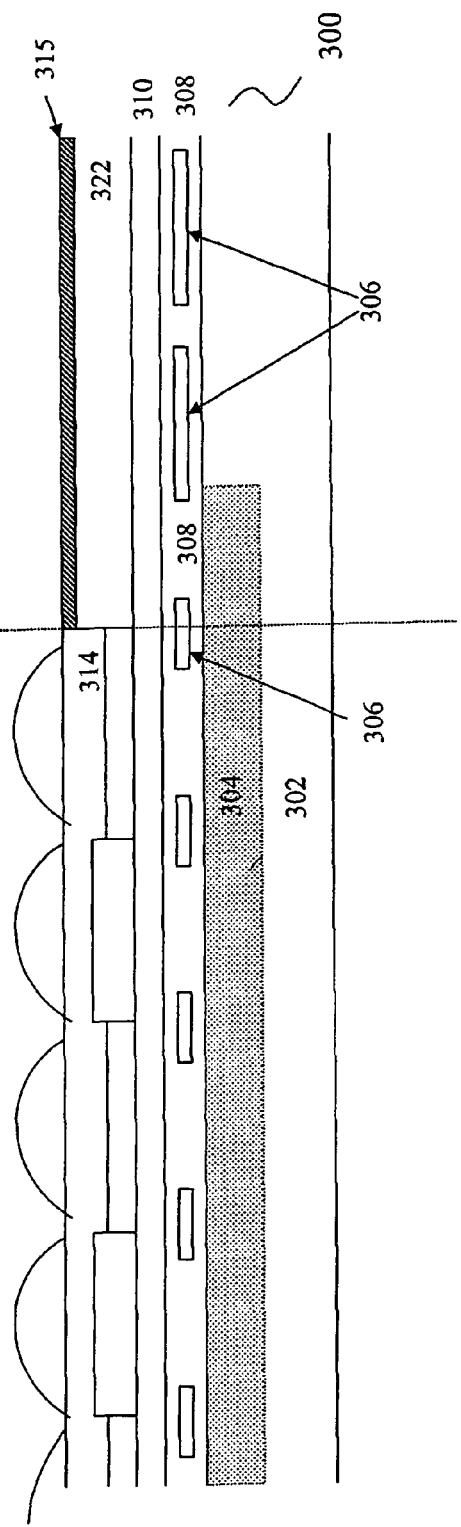

FIG. 3D illustrates another embodiment of the disclosed structure whereas the light blocking layer also serves to block the passage of light beams through the material layers from reaching the underlying metallized structures 306 and transistors within light sensing structure 304. For this embodiment, a TiN light blocking layer 315 is placed near the top of the CIS device 300. The basic construction and locations of the CIS device components in the peripheral area are very similar to the conventional CIS device as described for FIG. 2, except for the top two layers. FIG. 3D shows a material layer 322 on top of the conventional dielectric planarization layer 310. This material layer 322 may optionally be composed of a dielectric material as the device's spacer layer 314, or may be another material composition such as the black light shielding material as previously described as material layer 320 of the previous embodiments of both the conventional CIS device 200 and the disclosed CIS device 300. This embodiment of FIG. 3D features the disclosed light blocking layer 315 as the layer placed on top of the optional material layer 322. It is noted that the usage and placement of the light blocking layer 315 as the top material layer must be carefully chosen with the appropriate composition and thickness such that any exposed light will not pass through the combination of this light blocking layer 315 and the next underlying material layer 322 within the support periphery area to reach the underlying metallized structures 306 and transistors within the region 304.

The disclosed method of using thin material films such as TiN for a light blocking layer will minimize and help to eliminate the passage of light through the CIS device in the support periphery areas to become diffracted off of the underlying structures. This minimization and elimination of diffracted light will prevent stray and undesired oblique angled light from reaching the microlenses and light sensing pixels of the active light sensing pixel arrays. The implementation of the disclosed method and structure will enhance CIS production yields as well as improvement to the image accuracy and quality generated by the image sensor devices. Such improvements will translate into significant cost improvements for a given production facility to maintain highly competitive cost and output advantages over other manufacturers of similar product devices. As result, advanced device generations and performance levels may be more easily achieved and attained.

The disclosed structure may be easily designed into existing and future solid state image sensors, not restricted only to CIS image sensors, as well as into the production fabrication processes of said devices. For example, the mask set used for making the light shielding layer for the black color can be used for processing the non-transmitting light blocking layer. The present disclosure provides several examples to illustrate the flexibility of how the disclosed structure may be used and implemented. The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design and method for, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A CMOS image sensor comprising a light sensing structure at least partially surrounded by a support feature section, the CMOS image sensor including an active section of the light sensing structure covered by optically transparent materials and a light blocking portion including a black light filter layer on and directly contacting a transparent dielectric layer, the transparent dielectric layer on and directly contacting an opaque layer, the light blocking portion covering the support feature section and a covered section of the light sensing structure that is contiguous with and completely surrounds the active section of the light sensing structure, the light blocking portion not extending over the active section, and the light sensing structure being a uniform and unitary structure formed over a uniform substrate substructure.

2. The CMOS image sensor as in claim 1, wherein the light sensing structure comprises a pixel array in the active section.

3. The CMOS image sensor as in claim 1, wherein the light sensing structure further comprises transistors therein.

4. The CMOS image sensor as in claim 1, wherein the transparent dielectric layer further extends over the light sensing structure in the active section.

5. The CMOS image sensor as in claim 1, further comprising a further dielectric layer disposed between the support feature section and the opaque layer.

6. The CMOS image sensor as in claim 5, wherein the further dielectric layer is a planarization layer.

7. The CMOS sensor as in claim 5, wherein the further dielectric layer includes a plurality of metallized conductor data and bus lines disposed therein.

8. The CMOS image sensor as in claim 1, wherein the opaque layer is formed of a metal.

9. The CMOS image sensor as in claim 1, wherein the opaque layer is formed of TiN.

10. The CMOS image sensor as in claim 1, wherein the light sensing structure comprises a pixel array in the active section and includes at least one color filter formed over the pixel array.

11. The CMOS image sensor as in claim 10, wherein the light sensing structure comprises photosensors formed in or on the substrate in the active section.

12. The CMOS image sensor as in claim 11, wherein the active section includes microlenses formed over the photosensors.

13. A CMOS image sensor comprising a light sensing structure at least partially surrounded by a support feature section, the CMOS image sensor including an active section of the light sensing structure covered by optically transparent materials and a light blocking portion covering the support feature section and a covered section of the light sensing structure that is contiguous with and completely surrounds the active section of the light sensing structure, the light sensing structure being a uniform and unitary structure formed over a uniform substrate substructure, and the light blocking portion including a black light filter layer disposed on and directly contacting an opaque layer, the opaque layer disposed on and directly contacting a transparent dielectric layer, the transparent dielectric layer disposed on and directly contacting a further opaque layer and wherein each of the opaque layer and the further opaque layer is a metal layer.

* * * * *